United States Patent [19]

Olson et al.

[11] Patent Number: 5,223,043
[45] Date of Patent: Jun. 29, 1993

[54] CURRENT-MATCHED HIGH-EFFICIENCY, MULTIJUNCTION MONOLITHIC SOLAR CELLS

[75] Inventors: Jerry M. Olson, Lakewood; Sarah R. Kurtz, Golden, both of Colo.

[73] Assignee: The United States of America as represented by the United States Department of Energy, Washington, D.C.

[21] Appl. No.: 884,312

[22] Filed: May 11, 1992

Related U.S. Application Data

[63] Continuation of Ser. No. 653,543, Feb. 11, 1991, abandoned.

[51] Int. Cl.$^5$ .......................................... H01L 31/078
[52] U.S. Cl. ................................................ 136/249
[58] Field of Search ................................... 136/249 TJ

[56] References Cited

U.S. PATENT DOCUMENTS

| | | | |
|---|---|---|---|
| H667 | 9/1989 | Bedair et al. | |
| 4,179,702 | 12/1979 | Lamorte | 357/30 |
| 4,191,593 | 3/1980 | Cacheux | 136/259 |
| 4,271,328 | 6/1981 | Hamakawa et al. | 136/249 TJ |
| 4,272,641 | 6/1981 | Hanak | 136/249 TJ |
| 4,667,059 | 5/1987 | Olson | 136/249 TJ |
| 5,019,177 | 5/1991 | Wanlass | 136/249 TJ |

OTHER PUBLICATIONS

J. M. Olson et al. *Conf. Record, 20th IEEE Photovoltaic Specialists Conf.* (1988) pp. 777–780.

S. P. Tobin et al, *Conf. Record, 20th IEEE Photovoltaic Specialists Conf.* (1988), pp. 405–410.

"Monolithic AlGaAs/Ge Cascade Solar Cells" M. L. Timmons, J. A. Hutchby, D. K. Wagner, and J. M. Tracy, *Conference Record, 20th IEEE Photovoltaic Specialists Conference* (1988), pp. 602–606.

"Quantum Yield Spectra and I-V Properties of a GaAs Solar Cell Grown on a Ge Substrate", L. D. Partain, G. F. Virshup, and N. R. Kaminar, *Conference Record, 20th IEEE Photovoltaic Specialists Conf.* (1099), pp. 759–763.

"High Altitude Current-Voltage Measurement of GaAs/Ge Solar Cells" Russell E. Hart, Jr. and David J. Brinker, Keith A. Emery, *Conference Record, 20th IEEE Photovoltaic Specialists Conf.* (1988), pp. 764–765.

"Lightweight GaAs/Ge Solar Cells", Rushikesh M. Patel, S. W. Gersten, D. R. Perrachione, Y. C. M. Yeh, and D. K. Wagner, Applied Solar Energy Corporation; and R. K. Morris *Conference Record, 20th IEEE Photovoltaic Specialists Conf.* (1988), pp. 607–610.

*Primary Examiner*—Aaron Weisstuch
*Attorney, Agent, or Firm*—Kenneth Richardson; John M. Albrecht; William R. Moser

[57] ABSTRACT

The efficiency of a two-junction (cascade) tandem photovoltaic device is improved by adjusting (decreasing) the top cell thickness to achieve current matching. An example of the invention was fabricated out of $Ga_{0.52}In_{0.48}P$ and GaAs. Additional lattice-matched systems to which the invention pertains include $Al_xGa_{1-x}/GaAs$ ($x=0.3-0.4$), GaAs/Ge and $Ga_yIn_{1-y}P/Ga_{y+0.5}In_{0.5-y}As$ ($0<y<5$).

9 Claims, 10 Drawing Sheets

FIG. 9 p-LAYER THICKNESS/MINORITY CARRIER DIFFUSION LENGTH

CURRENT-MATCHED HIGH-EFFICIENCY, MULTIJUNCTION MONOLITHIC SOLAR CELLS

CONTRACTUAL ORIGIN OF THE INVENTION

The United States has rights in this invention under contract No. DE-AC02 83CHI0093 between the U.S. Department of Energy and the Solar Energy Research Institute, a division of Midwest Research Institute.

This is a Continuation of application Ser. No. 07/653,543 filed Feb. 11, 1991, now abandoned.

BACKGROUND OF THE INVENTION

1. Field of the Invention

The invention generally relates to photovoltaic solar cells and, more particularly, to high-efficiency multijunction photovoltaic solar cell devices in which the monolithic device uses GaInP as a thin top cell in order to improve current matching between the top and bottom cells. The current-matched device has a higher efficiency than the current-mismatched device because of a higher device current, and, in cases of low surface-recombination velocities, a higher device voltage. Specific lattice-matched material systems which also yield higher efficiencies under the current invention include $Al_xGa_{1-x}As/GaAs$ (x=0.3−0.4), GaAs/Ge and $Ga_{y-1}In_{1-y}P/Ga_{y+0.5-y}As$ (0<y<0.5).

2. Description of the Prior Art

Solar cells, also known as photovoltaic cells, are semiconductors that convert electromagnetic energy, such as light or solar radiation, directly to electricity. These semiconductors are characterized by solid crystalline structures that have energy bands gaps between their valence electron bands and their conduction electron bands, so that free electrons cannot ordinarily exist or remain in these band gaps. However, when light is absorbed by the materials that characterize the photovoltaic cells, electrons that occupy low-energy states are excited and jump the band gap to unoccupied higher energy states. Thus, when electrons in the valence band of a semiconductor absorb sufficient energy from photons of solar radiation, they jump the band gap to the higher energy conduction band.

Electrons excited to higher energy states leave behind them unoccupied low-energy positions which are referred to as holes. These holes may shift from atom to atom in the crystal lattice and the holes act as charge carriers, in the valence bond, as do free electrons in the conduction band, to contribute to the crystal's conductivity. Most of the photons that are absorbed in the semiconductor produce such electron-hole pairs. These electron-hole pairs generate photocurrent and, in the presence of a built-in field, the photovoltage of the solar cells.

Electron hole pairs produced by the light would eventually recombine, and convert to heat or a photon the energy initially used to jump the band gap, unless prevented from doing so. To prevent this phenomenon, a local electric field is created in the semiconductor by doping or interfacing dissimilar materials to produce a space charge layer. The space charge layer separates the holes and electrons for use as charge carriers. Once separated, these collected hole and electron charge carriers produce a space charge that results in a voltage across the junction, which is the photovoltage. If these separated hole and charge carriers are allowed to flow through an external load, they would constitute a photocurrent.

It is well known that photon energies in excess of the threshold energy gap or band gap between the valence and conduction bands are dissipated as heat; thus they are wasted and do no useful work. Specifically, there is a fixed quantum of potential energy difference across the band gap in the semiconductor. For an electron in the lower energy valence band to be excited to jump the band gap to the higher energy conduction band, it must absorb a sufficient quantum of energy from an absorbed photon with a value at least equal to the potential energy difference across the band gap.

A semiconductor is transparent to radiation with photon energy less than the band gap. But if the electron absorbs more than the threshold quantum of energy, e.g., from a larger energy photon, it can jump the band gap. The excess of such absorbed energy over the threshold quantum required for the electron to jump the band gap results in an electron that is higher in energy than most of the other electrons in the conduction band. Electrons that have energy levels higher than the lower edge of the conduction band, i.e., the top edge of the band gap, are referred to as "hot electrons". For every electron excited out of its normal energy level, there is a corresponding "hole". Thus, for each hot electron there can be a corresponding hot hole; both are generally referred to as "hot carriers".

These hot carriers lose their excess energy to the host lattice very rapidly as heat. The process in which the hot carriers dissipate their excess energy to the host lattice and equilibrate with the lattice at ambient temperature is known as thermalization. As a result, such thermalization of hot carriers reduces the carriers in energy to the energy level at the edge of the conduction band. Such thermalization normally occurs in about $10^{-12}$ seconds with the result that, the effective photovoltage of a single band gap semiconductor is limited by the band gap.

In practice, the effect of the limitation is that the semiconductor designer must sacrifice efficiencies in one area to achieve them in another. For example, to capture as many photons from the spectrum of solar radiation as possible, the semiconductor must be designed with a small band gap so that even photons from lower energy radiation can excite electrons to jump the band gap, but, in doing so, there are at least two negative effects that must be traded.

First, the small band gap results in a low photovoltage device, and thus low power output occurs. Secondly, the photons from higher energy radiation will produce many hot carriers with much excess energy that will be lost as heat upon immediate thermalization of these hot carriers to the edge of the conduction band. On the other hand, if the semiconductor is designed with a larger band gap to increase the photovoltage and reduce energy loss caused by thermalization of hot carriers, then the photons from lower energy radiation will not be absorbed. Therefore, in designing conventional single junction solar cells, it is necessary to balance these considerations and try to design a semiconductor with an optimum band gap, realizing that in the balance, there has to be a significant loss of energy from both large and small energy photons. Materials, such as silicon with a band gap of 1.1 eV, are relatively inexpensive and are considered to be good solar energy conversion semiconductors for conventional single junction solar cells; however, the band gap of GaAs is even better. Nevertheless, a need exists for a device that can capture and use a larger range of photon energies from the solar radiation spectrum, and yet not sacrifice either photovoltage or excess energy loss to heat by thermalization of hot carriers.

It was shown several years ago that two-junction photovoltaic cells have the potential for achieving solar energy conversion efficiencies than single junction cells.[1] The simplest junction device is a monolithic, two-terminal, two-junction structure, wherein the two junctions are stacked vertically. The top junction is designed to absorb and convert the blue portion of the solar spectrum and the bottom junction absorbs and converts the red portion of the spectrum that is not absorbed by the top junction. To achieve maximum energy conversion efficiency: 1) the junctions must be fabricated from materials that are of high electronic quality (usually achievable for systems which are lattice matched), and 2) they must also be current matched, i.e. generate equal currents when exposed in the tandem configuration to the solar spectrum. The current matching is determined by the relative band gap energies of the two materials.

[1] J.C.C. Fan, B.Y. Tsaur, and B.J. Palm, *Proceedings of the 16th IEEE Photovoltaic Specialists Conference* (IEEE, New York, 1982), p. 692.

Only a few material combinations are known that satisfy both these criteria. Strictly speaking, only the $Al_xGa_{1-x}As/GaAs$ system allows for both a lattice-matched and current-matched system for both space (AMO) and terrestrial (AM 1.5) applications. However, the high aluminum content makes it difficult to achieve material of high electronic quality despite good lattice matching. Other material combinations including $Ga_xIn_{1-x}P/Ga_{x+0.5}In_{0.5-x}As$ and GaAs/Ge meet both criteria depending on the spectrum under consideration, but are usually subject to some loss in efficiency. For tandem solar cells which are not exactly current matched the extra current that is generated either in the top or the bottom cell is lost. Of the multiple publications which have calculated the efficiencies of two-junction, III-V-like solar cells, the only suggested method for recovering this lost current is to use a 3.or 4-terminal device (using either independent or parallel connection). Use of 3. and 4.terminal devices has been considered to be substantially less convenient, yet a necessary remedy to an otherwise unsolvable problem for material combinations which lie away from the current-matched region.

In connection with amorphous silicon solar cells both U.S. Pat. Nos. 4,272,641 and 4,271,328 teach that the current and therefore the efficiency of a series-connected multi-junction solar cell where all of the unit cells have the same optical band gap is optimum when the thicknesses of unit cells closer to the incident light surface are selected to be less than that of cells farther from the incident light surface.

The problem that this invention addresses is taught by Hanak in U.S. Pat. No. 4,272,641. He teaches that the conversion efficiency of a single junction a-Si solar cell approaches a constant when the intrinsic region thickness exceeds about 500 nm See column 4, lines 6–16). This is due to an inherent problem with the electronic quality of a-Si. If a-Si could be made with better electronic properties then cells thicker than 500 nm would yield higher efficiencies. This problem is circumvented in a multi-junction cell where all of the unit cells have a thickness less than or equal to 500 nm. Hanak specifically teaches that the top cell (Region 22, FIGS. 1 & 2) is made to have a thickness between 40 and 500 nm (see Col. 3, lines 9–11). The thickness of the bottom cell (Region 26, FIGS. 1 & 2) is then adjusted so that "the current produced by said layer is about equal to the current produced by the first active layer 2. . . " (see Col. 4, lines 1–5).

Hanak also teaches use of multiband gap, multi-junction devices as an alternative method of matching currents in a tandem cell. The reasoning is that a top cell with a high enough band gap will obviate the need for current matching by the thinning of the top cell. Hanak and Hamakawa et al. do not teach literally a combined approach of thinning the top cell in a multiband gap, tandem solar cell.

The line of reasoning outlined above does not apply to III-V materials like GaAs, InP, AlGaAs, GaInPz, or InGaAs. They have inherently excellent electronic properties, and the conversion efficiency of devices made from these materials continue to increase for thicknesses much larger than 500 nm. Furthermore, a tandem device comprised of two GaAs unit cells (the GaAs analogue of an a-Si tandem cell) would have an efficiency less than that of a single junction GaAs cell.

We argue that the physical differences between a-Si and III-V materials is a subtle cognitive barrier that precludes the obvious foresighted extension of a-Si art to the III-V materials systems. This is evident if one considers the scope and direction of III-V tandem research and development since 1981. During this time period there have appeared in the literature several analyses of the efficiency of tandem solar cells as a function of top and bottom cell band gaps (e.g. Fan et al. *Proceedinqs of the 16th Photovoltaic Specialists Conference*, pp. 692–701, 1982; Nell and Barnett, *IEEE Trans. Electron Devices*. Vol. 34, p. 257, 1987). All of these calculations assume complete absorption by the respective unit cell of light with energy greater than the band gap energy of the unit cell, i.e. they only consider optically thick unit cells. There are also reports in the literature of the efficiency of III-V tandem devices including GaIn,P. 2/GaAs (Olson et al. 20th IEEE PVSC p.777 1988), AlGaAs/GaAs (Virshup et al.20th IEEE PVSC p.441 1988) and GaAs/Ge (Timmons et al. 20th IEEE PVSC p.602 1988). All Of these devices suffer a loss in efficiency because of poor current matching. All try to compensate for this loss by increasing the band gap of the top cell. In all cases this "cure" made the overall efficiency worse for reasons that are unique to III-V materials. In all three cases, the more effective cure would be to simply reduce the thickness of the top cell to some optimum thickness. That is exactly what Olson et al. have recognized and done, and the other "equally-skilled-in-the-art" researchers have not.

SUMMARY OF THE INVENTION

It is a general object of the invention to permit high-efficiency two-junction monolithic solar cells to be made from a greater number of material combinations, or to increase the efficiency of two-junction monolithic solar cells. This is achieved by thinning the top cell in order to equalize the currents generated in the top and bottom cells.

It is a specific object of the invention to provide increased efficiencies from two-junction monolithic solar cells made from top cell/bottom cell material combinations of $Ga_xIn_{1-x}P/GaAs$, $Al_xGa_{1-x}As/GaAs$ (x=0.3–0.4), GaAs/Ge, and $Ga_yIn_{1-y}P/Ga_{y+0.5}In_{0.}$-

$_{5-y}$As ($0<y<0.5$) by achieving current matching by thinning the top cell.

BRIEF DESCRIPTION OF THE DRAWINGS

FIG. 5b shows an isothickness plot showing the top-cell thicknesses used for the calculation of FIG. 5a.

FIG. 5c shows an isoefficiency plot for two-junction, series-connected tandem structures under AM1.5 global, 1-sun illumination at 300K The top-cell thickness was infinite.

DETAILED DESCRIPTION OF THE INVENTION

In general, the invention pertains to a two-junction, tandem solar cell in which the top cell has been thinned in order to match the currents generated by the top and bottom cell. Ordinarily, the thickness of a solar cell is chosen thick enough so that most of the light with energy higher than the band gap of the material is absorbed, yet thin enough that carriers generated toward the back of the cell can still be collected, (i.e. the thickness should not be much greater than the minority carrier diffusion length). In this way the current generated by the cell is effectively a maximum. For direct gap materials these criteria usually lead to a thickness of about 3 $\mu$m. According to the prior art, therefore, a two-junction tandem solar cell is made by stacking a top and bottom cell, both of which are about 3 $\mu$m thick. In the present invention, the bottom cell is made in the conventional manner, but the top cell is made thinner so that some of the light with energy above the band gap of the top cell passes through the top cell and is absorbed by the bottom cell, thus increasing the current generated by the bottom cell. In this way, the top- and bottom-cell currents are equalized, optimizing the efficiency of the tandem cell.

The invention pertains only to material systems that have top-cell currents larger than bottom-cell currents. If the top-cell current is smaller than the bottom-cell current, thinning the top-cell will lead to a greater current mismatch. Although the bottom cell could be thinned, in such a case, to achieve current matching, the efficiency gain is negligible since the top-cell current will remain fixed while the bottom-cell current is reduced. Thus, the material systems which are affected by the current invention include only those which have top-cell currents larger than the bottom-cell currents. Specifically, these include Ga$_x$In$_{l-x}$P/Ga$_{x+0.5}$In$_{0.5-x}$As ($0<x<0.5$), Al$_y$Ga$_{l-y}$As/GaAs ($y=0.3-0.4$) and GaAs/Ge.

The currents generated in the top and bottom cells are functions not only of the band gaps of the two materials, but also of the solar spectrum and the quantum efficiency. The solar spectrum depends on the air mass (zenith angle of the sun) and various atmospheric conditions including humidity, turbidity, and cloud cover. Outside of the earth's atmosphere the solar spectrum is markedly different than at the earth's surface. Also, the spectrum will depend upon the geometry of collection: for cells operating under concentration only the direct beam is collected, while for flat-plate solar cells, off-normal radiation (which is rich in short wavelength light) can also be collected. Although terrestrial solar cells must operate under a range of conditions it is customary to design the solar cell for optimal efficiency under a set of conditions which will be representative of the application. Typically, solar cells are designed for operation in space under air mass 0 illumination, or for terrestrial operation under air mass 1.5 illumination.

Table 1 shows the estimated top cell thicknesses which will lead to current matching for the noted band gap combinations and material systems. We have selected two of the most commonly used spectra rather than trying to make an exhaustive list. It is not possible to specify exact thicknesses since these depend (as noted above) not only on the spectrum, but on the quantum efficiency of the device. The quantum efficiency is dependent on the quality of the solar cell material, the quality (small absorption and good passivation) of the window layer (front-surface field) and back-surface passivation and/or reflection, and the reflectivity of the entire device. For example, we estimate that a 30 nm layer of $Al_{0.5}In_{0.5}P$ (used as a window layer for the top cell) and a 30 nm-thick GaAs tunnel junction each absorb approximately 3% of the light destined for the respective underlying subcell. In this case the losses do not affect the current matching, but in another case it might.

TABLE 1.

Examples of Tandem Cells With Optimized Top Cell Thickness

| Bandgap combination Examples | Top Cell Thickness for AM 1.5, Global (microns) | Top Cell Thickness for AMO (microns) |
|---|---|---|
| 1.9/1.424 eV $Ga_xIn_{1-x}P/GaAs$ or $Al_xGa_{1-x}As/GaAs$ | 1.0 | 0.7 |
| 1.85/1.424 eV $Ga_xIn_{1-x}P/GaAs$ or $Al_xGa_{1-x}As/GaAs$ | 0.7 | 0.5 |
| 1.65/1.1 eV $Ga_xIn_{1-x}P/Ga_yIn_{1-y}As$ | 0.8 | 0.7 |
| 1.424/0.8 eV GaAs/Ge (direct gap) | 1.0 | 1.6 |
| 1.38/0.7 eV $InP/Ga_{0.5}In_{0.5}As$ | 0.7 | 1.7 |

We describe in detail the fabrication of a $Ga_{0.5}In_{0.5}P$-/GaAs two-junction solar cell, where the band gap combination is 1.85 and 1.424 eV. The fabrication of similar devices from the other material combinations shown in Table 1 can be accomplished by substituting the appropriate reagents and flows.

Figure 1:
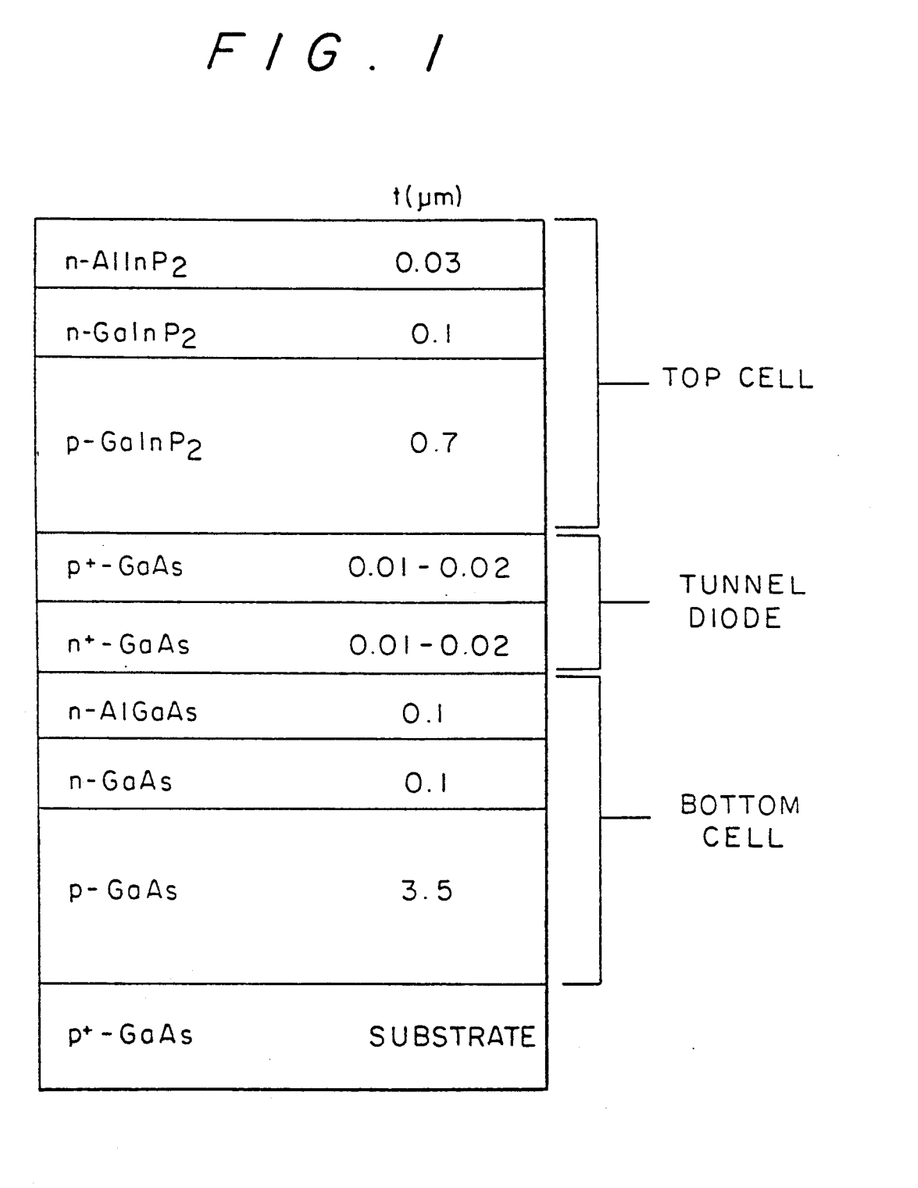
FIG. 1 is a side elevation view schematic of the GaInP$_2$/GaAs monolithic cascade cell exemplifying the present invention.

A schematic of the $GaInP_2$/GaAs monolithic cascade cell is shown in FIG. 1. The structure was grown in a vertical, air-cooled reactor at one atmosphere using organometallic chemical vapor deposition (OMCVD), the detailed aspects of which are described elsewhere.[2] The Group III source gases were trimethylindium, trimethylgallium, and trimethylaluminum; the Group V source gases were arsine and phosphine. The dopant sources were diethylzinc and hydrogen selenide. The optoelectronic properties[3] and photovoltaic quality[4] of the materials set forth above are complex and coupled functions of the growth temperature, $T_g$, the V/III materials ratio, composition, dopant type and concentration, and substrate quality and the effects of some of these factors are demonstrated.

[2]J.M. Olson and A. Kibbler. *J. Crystal Growth.* 77. 182(1986).
[3]S.R. Kurtz, J.M Olson and A. Kibbler, *Solar Cells*, 24,307 (1988).
[4]J.M. Olson, A.E. Kibbler and S.R. Krtz, *Proceedings of the 19th IEEE Photovoltaic Specialists Conference*, (IEEE, New York, 1987), p. 285.

Generally, the cascade device is grown at $T_g = 700°$ C., The phosphides are grown with V/III = 30 and a growth rate of 80-100nm/minute; the arsenides, with V/III = 35 and a growth rate of 120-150 nm/minute, with the exception that the GaAs tunnel diode is grown at a rate of 40 nm/minute.

The absorbers of both subcells are doped with Zn to a level of $1-4 \times 10^{17} cm^{-3}$, and the emitters and window layers are doped with Se at about $10^{18} cm^{-3}$. Both layers of the GaAs tunnel diode are heavily doped at concentrations approaching $10^{19} cm^{-3}$. Tunnel diodes grown under conditions simulating the fabrication of a full cascade device have a series resistance of $10^{-3}-10^{-2}$ ohm $cm^2$, and exhibit other characteristics that are similar to those reported by Saletes et al.[5] For example, they are relatively stable at 700° C. for at least 30-40 minutes.

[5]A. Saletes, A. Rudra, P. Basmaji, J.F. Carlin, M. Lerous, J.P. Contour, P. gibrt and C. Verie, *Proceedings of the 19th IEEE Photovoltaic Specialists Conference*, (IEEE, New York, 1987), p.124.

The front and back contacts of these devices were electroplated gold. A high dopant concentration is used in both the GaAs substrate and the top GaAs contacting layer (not shown in the FIG. 1), and therefore, no thermal annealing of either contact is required. The front contact is defined by photolithography and obscures approximately 5% of the total cell area. The cell perimeter is also defined by photolithography and a mesa etch that uses a sequential combination of concentrated hydrochloric acid and an ammonia:peroxide:water solution. The ammonia/peroxide solution is also used to remove the GaAs contacting layer between the gold grid fingers. The antireflection coating (ARC) is a double layer of evaporated ZnS and $MgF_2$, with thicknesses of 60 and 120 nm, respectively.

Cell efficiency was measured using the multisource simulator method of Glatfelter and Burdick.[6] The simulated solar spectrum was adjusted using two reference cells. One reference cell was a $GaInP_2$ top cell and the second was a GaAs cell coated with the GaAs tunnel junction and a layer of $GaInP_z$ to simulate the optical transmission to the GaAs bottom cell in the actual tandem device. The spectrum of the simulator was adjusted with filters until both reference cells produced the correct ASTM E892 87 global, short-circuit current at 1000 $W/cm^2$. Using this spectrum, the voltage characteristic of the cascade cell was measured.

[6]Troy Glatfelter and Joseph Burdick, *Proceedings of the 19th IEEE Photovoltaic Specialists Conference*, (IEEE, New York, 1987) p.1187.

The best efficiency measured for this device is 27.3% (1 sun, air mass 1.5). The short circuit current density, $J_{xc}$, open circuit voltage, $V_{oc}$, and fill factor, ff, were 13.6 mA $cm^{-2}$, 2.29V, and 0.87, respectively. The area of this device was 0.25 $cm^2$ and the band gap of the top cell was 1.85 eV. This is the highest efficiency reported for a two-terminal, tunnel-junction-interconnected tandem photovoltaic device, and represents a significant improvement with respect to previously reported work.[7] Part of this improvement is a direct result of using a thinner top cell. Recently, Chung et al.,[8] have reported a 27.6% efficient monolithic AlGaAs/GaAs solar cell; however, this device has a metal, as opposed to a tunnel-junction, interconnect and includes a prismatic cover slip to eliminate the photocurrent loss associated with grid shadowing. In the case of the present invention, the use of the prismatic cover slip would boost the efficiency from 27.3 to 28.7%.

[7]J.M. Olson, A.E. Kibbler and S.R. Kurtz, *Proceedings of the 19th IEEE Photovoltaic Specialists Conference*, (IEEE, New Yrok, 1987), p 285.
[8]B.C. chung, G.F. Virshup, S. Hikido, and N.R. Kaminar, *App. Physics Lett.* 55, 1741 (1989). [9]S.R. Kurtz and J.M. Olson, *Proc. of 19th IEEE Photovoltaics Speialists Conference.* (IEEE, New York, 1987) p. 823.

Numerous factors affect the efficiency of a multi junction solar cell, including, but not limited to, the electronic quality of the top and bottom cell materials, the band gap and thickness of the top cell, the design of the ARC, and the thickness and passivating properties of the window layers.

Figure 2A:
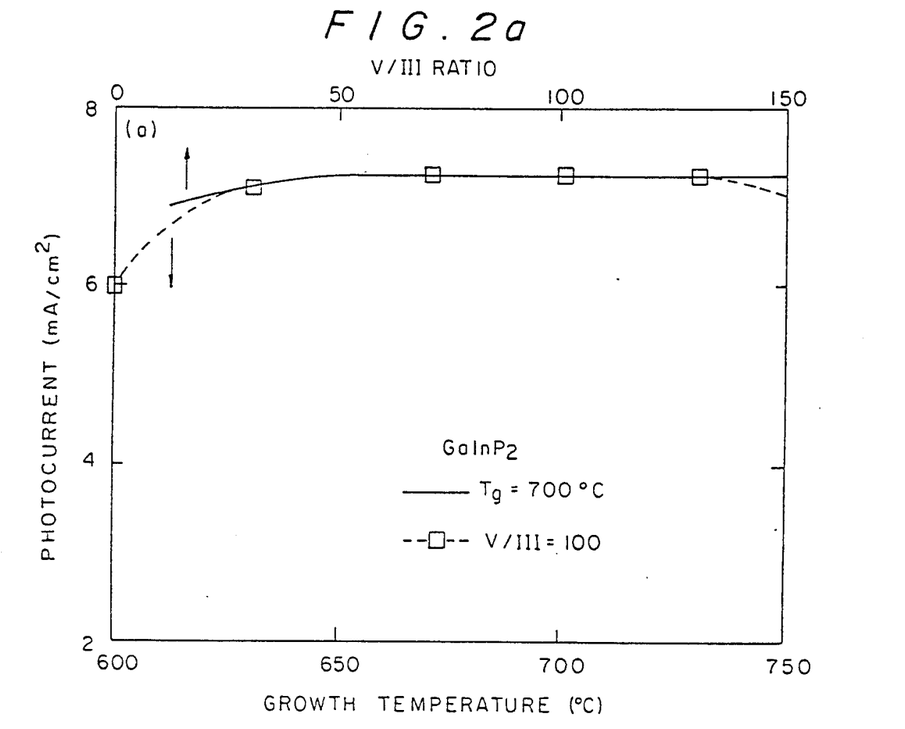
FIG. 2a is a graph showing the bulk electronic quality of GaInP$_2$ as a function of growth parameters where photocurrent versus Tg and IV/III for GaInP$_2$.
Figure 2B:
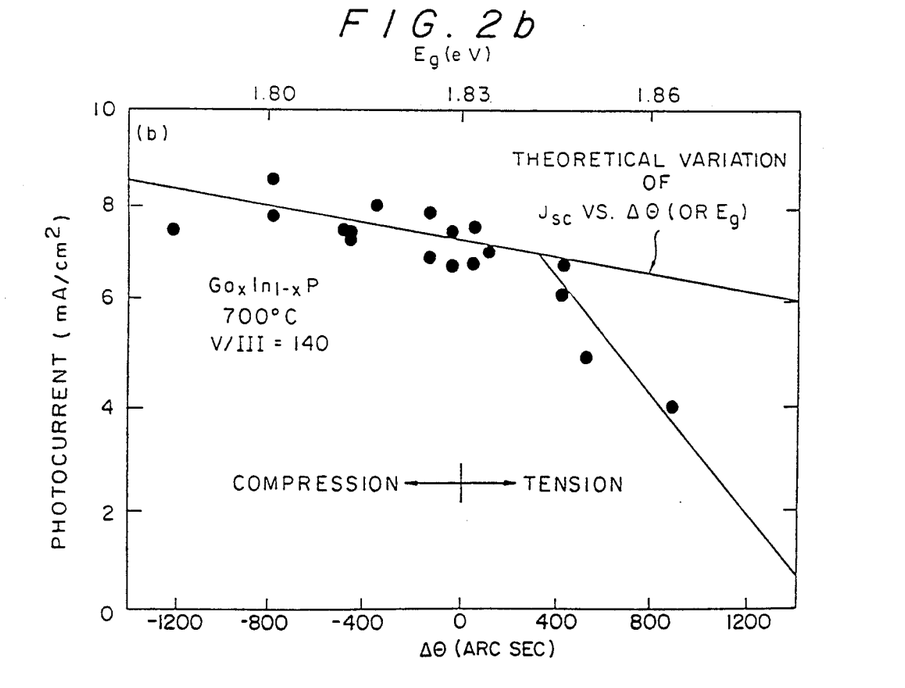
FIG. 2b is a graph showing the bulk electronic quality of GaInP$_2$ as a function of growth parameters where the photocurrent versus band gap or lattice mismatch as measured by x-ray diffraction.

Bulk electronic quality of $GaInP_2$ as a function of growth parameters is illustrated in FIGS. 2a and 2b. Plotted is the relative white-light photocurrent generated at an electrolyte/$GaInP_2$ junction as a function of the $GaInP_2$ growth temperature, the V/III ratio and lattice mismatch between the GaInP and the GaAs.

This photocurrent is a function mainly of the minority carrier diffusion length in the GaInP$_2$, and, therefore, is a suitable quantity to use as a measure of quality.[9] The highest relative currents shown in FIG. 2a for GaInP$_2$ are indicative of a minority carrier diffusion length in the range of 3-6 μm and a peak internal quantum efficiency of about 90%. It is evident from FIG. 2a that the quality of GaInP$_2$ is relatively insensitive to Tg and V/III. This is contrary to previous reports where the photoluminescence intensity of GaInP$_2$ grown by MOCVD was found to increase by a factor of $10^3$ when the growth temperature[10] was decreased from 675° C. to 650° C. or the V/III ratio was increased from 100 to 200.

[9] S.R. Kurtz and J.M. Olson, *Proc. of 19th IEEE Photovoltaics Specialists Conference,* (IEEE, New York, 1987) p. 823.
[10] J.S. Yuan, M.T. Tsai, C.H. Chen, R.M. Cohen, and G.B. String felow, *J. Appl. Physics,* 60, 1346 (1986).
[11] Y. Ohba, M. Ishikawa, H. Sugawr, M. Yamamoto, and T. Nakanisi, *J. Crystal Growth,* 77, 374 (1986).

The effect of lattice mismatch is shown in FIG. 2b. The lattice mismatch (proportional to φ, the Bragg peak separation) is measured using the double-crystal rocking mode x-ray diffraction technique. As expected, the photocurrent decreases rapidly for tensional strains greater than some critical mismatch strain. For material grown in compression, the photocurrent increases with increasing mismatch. This increase is due to a concomitant decrease in the band gap of the Ga$_x$In$_{1-x}$P. This result is contrary to a previous report[12] that suggested that precise control of the composition of GaInP$_2$ was required to achieve device-quality material.

[12] G.H Olsen and M. Ettenberg, in "Crystal Growth Theory and Technique", edited by C.H.L. Goodman, (Plenum press, New York, 1978), vol. 2, p.47.

A model that couples the optical properties of the double layer ARC with those of the underlying junctions materials was developed for this study. The reflection coefficient, R, of an AlInP$_2$-coated GaInP$_2$ epilayer is about 30% for wavelengths between 450 and 900 nm. A ZnS and MgF$_2$ARC with thicknesses of 60 and 120 nm, respectively, reduces R to less than 2% over the same range of wavelengths. While these thicknesses are close to those that one would calculate from simple quarter wavelength considerations, the detailed effects of these antireflection layers is considerably more complicated. For example, the optical modeling studies show that the current matching between the top and bottom cells is a strong function of the ZnS and MgF$_2$ thicknesses.

By using a similar optical model, it was calculated that a 30 nm layer of AlInP and 30 nm-thick GaAs tunnel junction each absorb approximately 3% of the light destined for the respective underlying subcell. It is apparent that most of this light is not converted into external current, and that the tandem cell current therefore suffers a net loss of 3%.

It has been shown that AlInPz passivates the surface of GaAs,[13] reducing the surface recombination velocity S, to less than 100 cm/s. For the AlInPz/GaInPz interface, S has not been measured; however, controlled experiments show that the blue response and total short circuit current density of GaInP$_2$ solar cells are enhanced by the use of an AlInP window layer.

[13] J.M. Olson, R.K. Ahrenkiel, D.J. Dunlavy, Brian Keyes, and A.E. Kibbler, *Appl. Physics Lett.* 55, 1208 (1989).

For the GaInP$_2$/GaAs tandem cell, a significant potential loss mechanism is associated with current matching between the top and bottom cells. As stated previously, the top cell and bottom cell currents, J$_T$ and J$_B$, respectively, are determined primarily by the band gaps of the top and bottom cell materials. It was assumed in previous treatments of this problem that the subcells were infinitely thick and that quantum efficiencies were equal to 100%. With assumptions, for a bottom-cell band gap of 1.42 eV the optimum top cell band gap for an AM1.5 solar spectrum is 1.93 eV. Because the nominal or classical band gap of GaInpz is 1.9 eV, it is expected that for a thick, high quality GaInPz top cell on a GaAs bottom cell, J$_T$/J$_B$ > 1. Worse yet, the band gap of OMCVD-grown GaInP$_2$ can be as low as 1.82 eV.

The solution to this problem is to reduce the thickness of the GaInP$_2$ top cell. The method used to calculate the top cell thickness for the GaInP2/GaAs tandem cell is given in the next section. These calculations suggest that top cell thicknesses in the range of 500 to 100 nm, depending on the top cell band gap and quantum efficiency yield a current-matched tandem structure at a current level that changes only slightly with top cell band gap. The device in FIG. 1 has top cell band gap of 1.85 eV and a top cell of thickness of 0.7 μm. This thickness is slightly larger than the optimum value, so that this device may not be current matched; however, it is clear that a GaInP$_2$/GaAs, two-terminal tandem cell with a 1-sun, air mass 1.5 has a conversion efficiency of 27.3%, the highest efficiency reported for a tunnel-junction interconencted tandem device, thus factors limiting the optimum efficiency of this device have been identified.

METHOD

The theoretical efficiencies of two-junction, infinitely thick, series-connected solar cells based on III-V-like (direct gap) solar cells have been published by a number of researchers. However, the theoretic efficiencies for similar devices with thinned top cells have not been published. We present here a description of how using optimal top-cell thicknesses increases the efficiencies primarily because of an increase in short-circuit current, but also, in the case of low back-surface recombination, by increasing the open-circuit voltage.

The theoretical solar-cell efficiencies were calculated for air mass (AM) 1.5 global, AM 1.5 direct normal, and, in some cases, AMO spectra, using the irradiance standards published by Hulstrom, et al., and trapezoidal integration. The total power densities are 964 and 768 W/m2, for the global and direct normal spectrums, respectively.

[14] R. Hulstrom, R. Bird and C. Riordan. *Solar Cells,* 15,365 (1985).
[15] J.C.C. Fan, B.-Y. Tsaur, and B.J. Palm, in *Proceedings of the 16th IEEE Photovoltaic Specialists Conference (IEEE, New York,* 1982), p. 692.
[16] the calculations are discussed in more detail in reference 15 and in books such as Martin A. Green, *Solar Cells, Operating Principles, Technology, and System Applications,* (Prentice-Hall, Englewood Cliffs, New Jersey, 1982), pp. 62-101; Alan L. Fahrenbruch and R.H. Bube, *Fundamentals of Solar Cells Photovoltaic Solar Energy Conversion,* (Academic Press, New York, 1983), pp. 210-243.

In contrast to earlier referred to publications which assumed that each cell was infinitely thick[15] (i.e. absorbed all of the light with energy greater than the material's band gap), the short-circuit currents were calculated[16] as a function of the top-cell thickness as follows:

$$J_T = \sum_\lambda eI_o(\lambda)\Delta\lambda[1 - \exp(-\alpha(\lambda)t)]$$

and $$J_B = \sum_\lambda eI_o(\lambda)\Delta\lambda\exp[-\alpha(\lambda)t]$$

where $J_T$ and $J_B$ are the photocurrents of the top and bottom cells, respectively, e is the electronic charge, Io (λ) is the incident intensity as a function of wavelength (taken from the spectral tables of Hulstrom, et al.),[17] α is the absorption coefficient of the top-cell material, and t is the thickness of the top cell. The integration step width, was 1/30 of the wavelength step shown in the tables.[18]

[15]J.C.C. Fan, B.Y. Tsaur, and B.J. Palm, in *Proceedings of the 16th IEEE Photovoltaic Specialists Conference* (IEEE, New York, 1982), p. 692.
[16]The calculations are discussed in more detail in reference 15 and in books such as Martin A. Green, *Solar Cells, Operating Principles, Technology, and System Appplications*, (Prentice-Hall, Englewood Cliffs, New Jersey, 1982), pp. 62-101; Alan L. Fahrenbruch and R.H. Bube, *Fundamentals of Solar Cells Photovoltaic Solar Energy Conversion*, (Academic Press, New York, 1983), pp 210-243.
[17]R. Hulstrom, R. Bird and C. Riordan, *Soalr Cells*,15,365 (1985).
[18]R. Hulstrom, R. Bird and C. Riordan, *Solar Cells*, 15 365 (1985).

The short-circuit current, $J_{sc}$, of the cell was then taken as the lesser of $J_T$ and $J_B$. The thickness of the top cell was adjusted to obtain $J_t = J_B$ whenever possible (i.e. whenever $J_T > J_B$ for the infinite-thickness cells), ±1 μA/cm$^2$. This arbitrary limit gives an accuracy of about 0.1% for the thickness and 0.01% for $J_{SC}$ in most cases.

Figure 3:
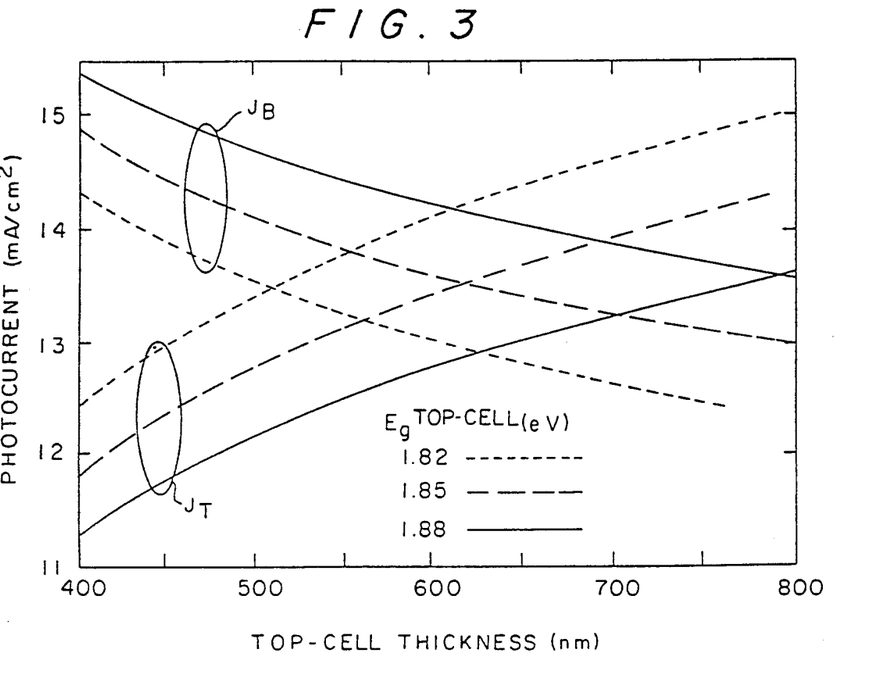
FIG. 3 is a schematic of a tandem solar cell model used in the invention.

The reverse saturation current density, $J_o$, was calculated for each cell as the sum of the currents for the n- and p-type layers using the cell design in FIG. 1:

$$J_o = e\left(\frac{D_e}{\tau_e}\right)^{\frac{1}{2}} \frac{n_i^2}{N_A} \left[ \frac{S_e\left(\frac{\tau_e}{D_e}\right)^{\frac{1}{2}} \cosh\left(\frac{x_p}{\sqrt{D_e\tau_e}}\right) + \sinh\left(\frac{x_p}{\sqrt{D_e\tau_e}}\right)}{S_e\left(\frac{\tau_e}{D_e}\right)^{\frac{1}{2}} \sinh\left(\frac{x_p}{\sqrt{D_e\tau_e}}\right) + \cosh\left(\frac{x_p}{\sqrt{D_e\tau_e}}\right)} \right] + \\ e\left(\frac{D_h}{\tau_h}\right)^{\frac{1}{2}} \frac{n_i^2}{N_D} \frac{S_h\left(\frac{\tau_h}{D_h}\right)^{\frac{1}{2}} \cosh\left(\frac{x_n}{\sqrt{D_h\tau_h}}\right) + \sinh\left(\frac{x_n}{\sqrt{D_h\tau_h}}\right)}{S_h\left(\frac{\tau_h}{D_h}\right)^{\frac{1}{2}} \sinh\left(\frac{x_n}{\sqrt{D_h\tau_h}}\right) + \cosh\left(\frac{x_n}{\sqrt{D_h\tau_h}}\right)} \quad (2)$$

where $N_A$ and $N_D$ are the acceptor and donor concentrations taken from FIG. 3 $S_h$ and $S_e$ are the surface-recombination velocities in the n- and p-type materials, $x_p$ and $x_n$ are the thicknesses of the p- and n-type layers, respectively, $D_e$ and $D_h$ are the diffusion constants for electrons and holes, respectively, calculated from the Einstein relationship, $n_i$ is the intrinsic carrier concentration, and $\tau_e$ and $\tau_h$ are the minority carrier lifetimes.

Ideally, the reverse saturation currents would be calculated in each case using the parameters for a known material of that band gap. However, this is not practical, so literature values for GaAs were used with scaling appropriate for band gap. In the cases where an actual top-cell thickness is calculated, the absorption coefficient and other parameters applicable to GaInP$_2$ were used.

The open-circuit voltage, V$_{oc}$, was calculated[19] from:

$$V_{oc} = \frac{kT}{e} \ln\left(\frac{J_{sc}}{J_o} + 1\right)$$

The power from the cell is given by the product of the cell voltage V, and cell current J, and was maximized by satisfying the condition $$\frac{d(JV)}{dJ} = 0,$$

where the cell voltage was calculated from the combined current-voltage curves:

$$V = \frac{kT}{e}\left[\ln\left(\frac{J + J_T}{J_{oT}} + 1\right) + \ln\left(\frac{J + J_B}{J_{oB}} + 1\right)\right].$$

$J_{TO}$ and $J_{OB}$ are the reverse saturation currents for the top and the bottom cells, respectively. This represents an improvement over the previously-used method[20] of calculating the maximum power points of the two separate cells.

[19]The calculations are discussed in more detail in references 18-20 and in books such as Martin A. Green, *Solar Cells, Operating Principles, Technology, and System Applications*, (Prentice-Hall, Englewood Clipps, New Jersey, 1982), pp. 62-101; Alan L. Fahrenbruch and R.H. Bube, *Fundamentals of Solar Cells-Photovoltaic Solar Energy Conversion*, (Academic Press, New York, 1983), pp. 210-243.
[20]J.C.C. Fan, B.-Y. Tsaur, and B.J. Palm, *Proceedings of the 16th IEEE Photovoltaic Specialists Conf.* (IEEE, New York, 1982), 692.

Figure 4:
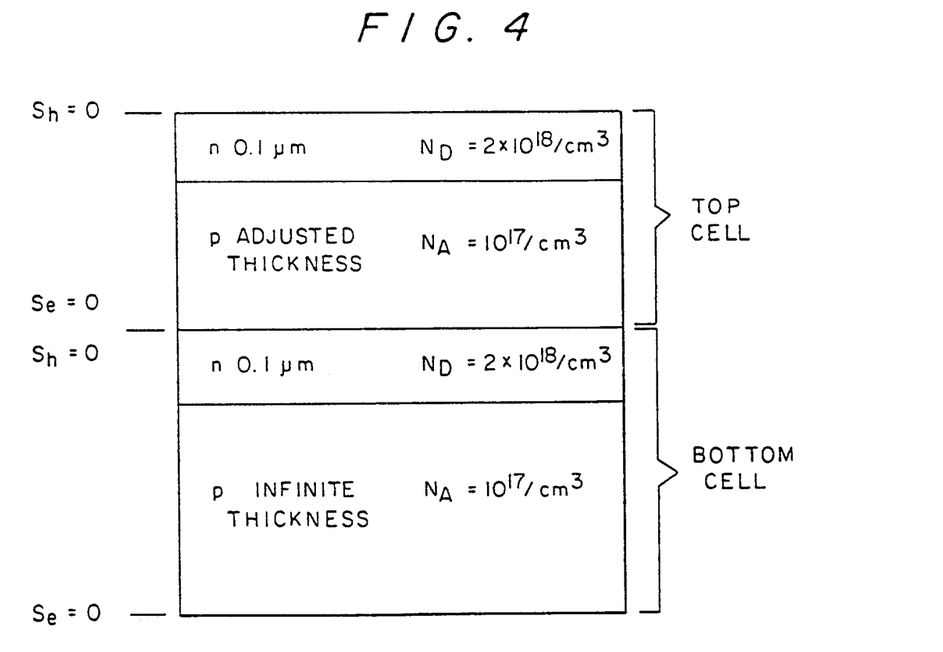
FIG. 4a is an is efficiency plot for two-junction, series-connected tandem structures under AM1.5 global, 1-sun illumination at 300K. The top-cell thickness was adjusted for current matching.
FIG. 4b is an isoefficiency plot for two-junction, series-connected tandem structures under AM1.5 global, 1-sun illumination at 300K. The top-cell thickness was infinite.
Figure 5A:
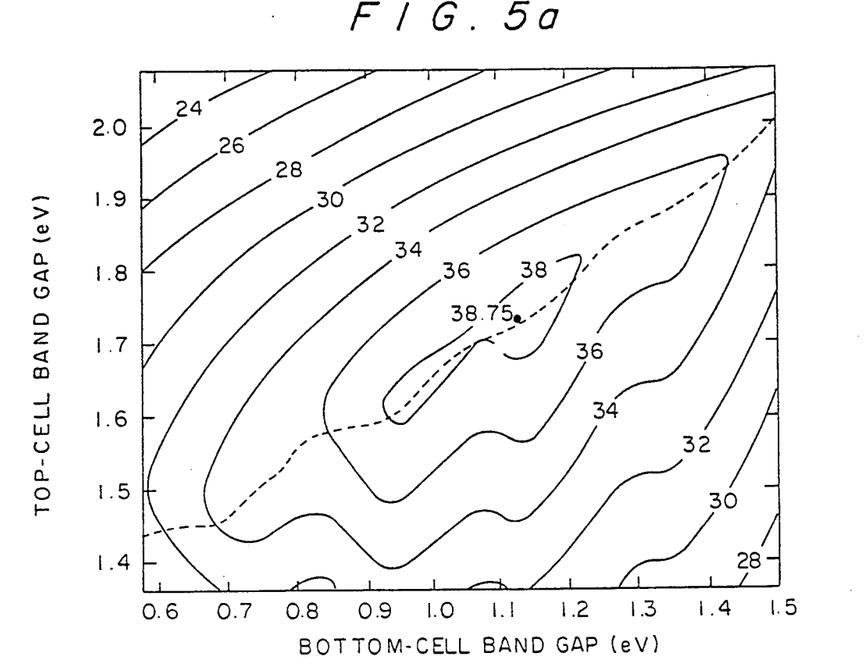
FIG. 5a shows an isoefficiency plot for two-junction, series connected tandem structures under AM1.5 global, 1-sun illumination at 300K. The top-cell thickness was adjusted for current matching.
Figure 5B:
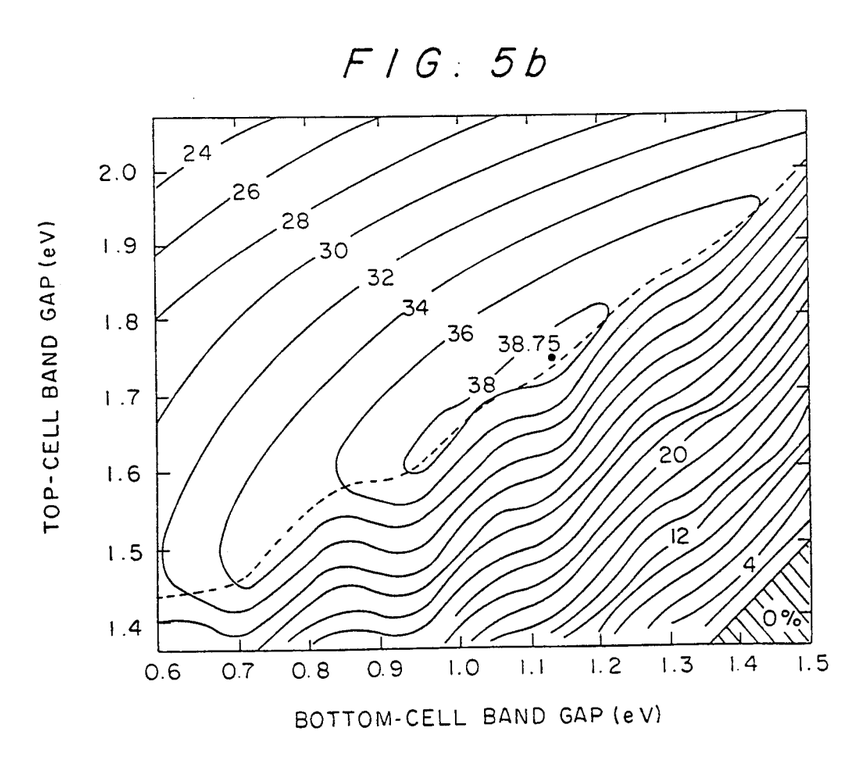

The isoefficiency contour plot is shown for the AM1.5 global spectrum in FIG. 4a. For comparison, the corresponding plot assuming an infinite thickness for the top cell is shown in FIG. 4b.

A comparison of FIGS. 4a and 4b or 5a, 5b, and 5c shows the effect of varying the the thickness of the top cell to obtain current-matched condition. The effect of thinning the top cell can be understood better by studying curves A, B, and C of FIG. 6a, which show the efficiency of a tandem structure with a bottom-cell band gap of 1.42 eV as a function of top-cell band gap. Curve A represents the efficiency when the top cell is required to have an infinite thickness. Curve B was calculated by varying the thickness of the top cell to obtain current-matched conditions, but without recalculating J$_o$. This gives an increase in J$_{SC}$ but no change in V$_{OC}$. Curve C shows the effect of recalculating J$_O$ for the thinner layer. The smaller J$_O$ results in an increase in V$_{OC}$ as shown in the upper half of the graph, and therefore, an increase in efficiency. Comparison of curves A, B and C shows that the primary advantage of using thinner top cells is a gain in J$_{SC}$, but that in cases of low surface recombination, additional gain is made in the V$_{OC}$.

Figure 6A:
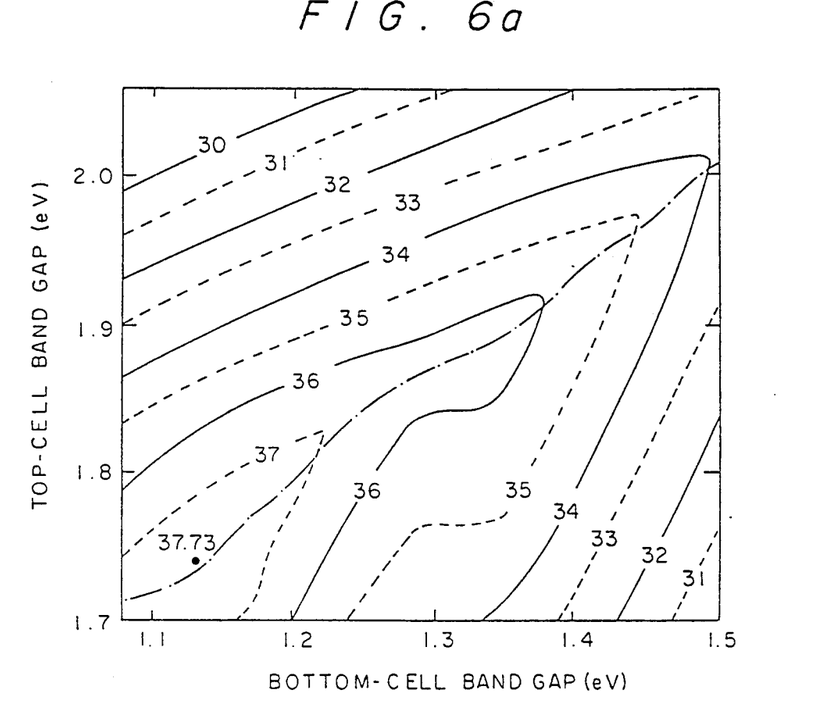
FIG. 6a shows efficiency and open-circuit voltage as a function of top-cell band gap for a bottom cell with band gap of 1.42eV and AM 1.5 global irradiation. Curve A assumes an infinite thickness for the top cell. Curve B varies the top-cell thickness to achieve current matching but does not recalculate J$_o$. Curve C repeats Curve B, but includes a recalculation of J$_o$, assuming no surface recombination. In contrast to the other curves, curve D was calculated for a four-terminal device, using the same models as for Curves A–C and an infinite thickness for the top cell.
Figure 7A:
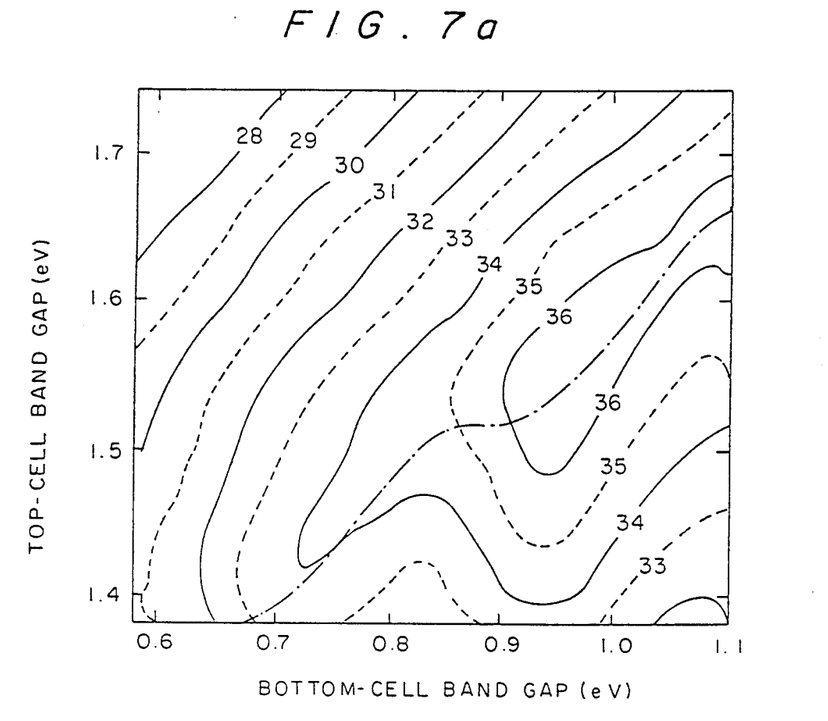
FIG. 7 shows the effect of p-layer thickness and surface recombination on the open-circuit voltage, wherein dimensionless list variables are used for the p-layer thickness. The change in open-circuit voltage is shown for various surface-recombination ratios.
Figure 7B:
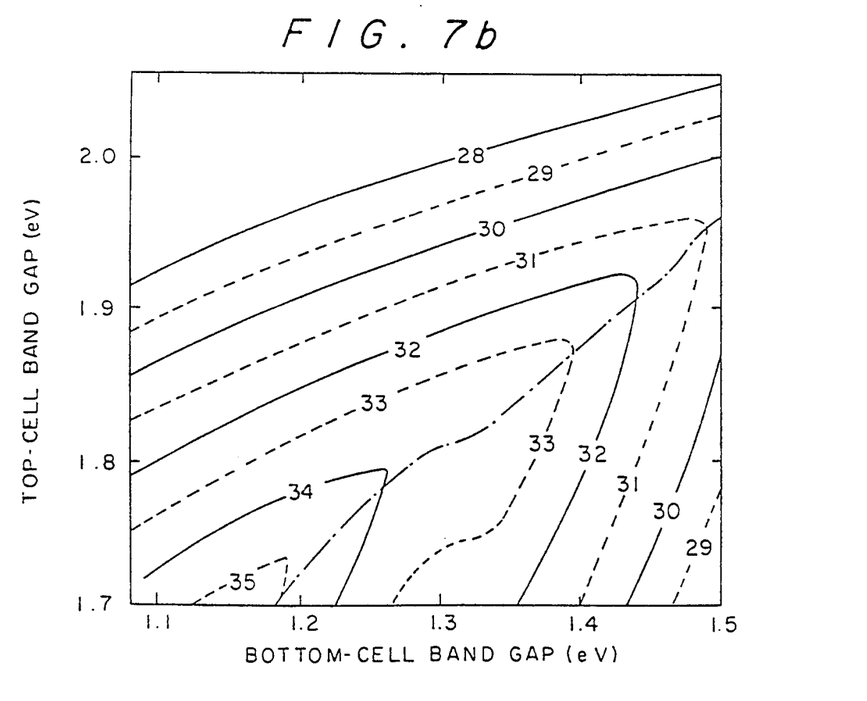

The gain in V$_{OC}$ will be less than that shown in FIG. 6a when the surface-recombination velocities are not zero. The combined effects of surface-recombination velocity and thinning of the cell are shown in FIG. 7. For simplicity, only the effect of recombination at one surface is considered. In this case the subscripts refer to recombination in the p-type material This is done by setting $S_hL_h/D_h=1$, where $L_h$ is the minority carrier diffusion length of holes. This makes $J_o$ independent of the n-layer thickness. The relative $V_{oc}$ is then a function of $x_p/L_e$ and $S_eL_e/D_3$. which are dimensionless expressions for the p-layer thickness and p-layer surface-recombination velocity, respectively, and $L_e$ is the diffusion length of minority carrier electrons. For $S_eL_e/D_e=1$ does not vary with the p-layer thickness. For lower surface-recombination velocities, the $V_{oc}$ increases as the p layer is thinned. However, it should be noted that the $V_{oc}$ is expected to decrease as the cell is thinned when the surface-recombination velocity is high. The same graph is equally applicable to n-type material if all subscripts are replaced appropriately.

Figure 8A:
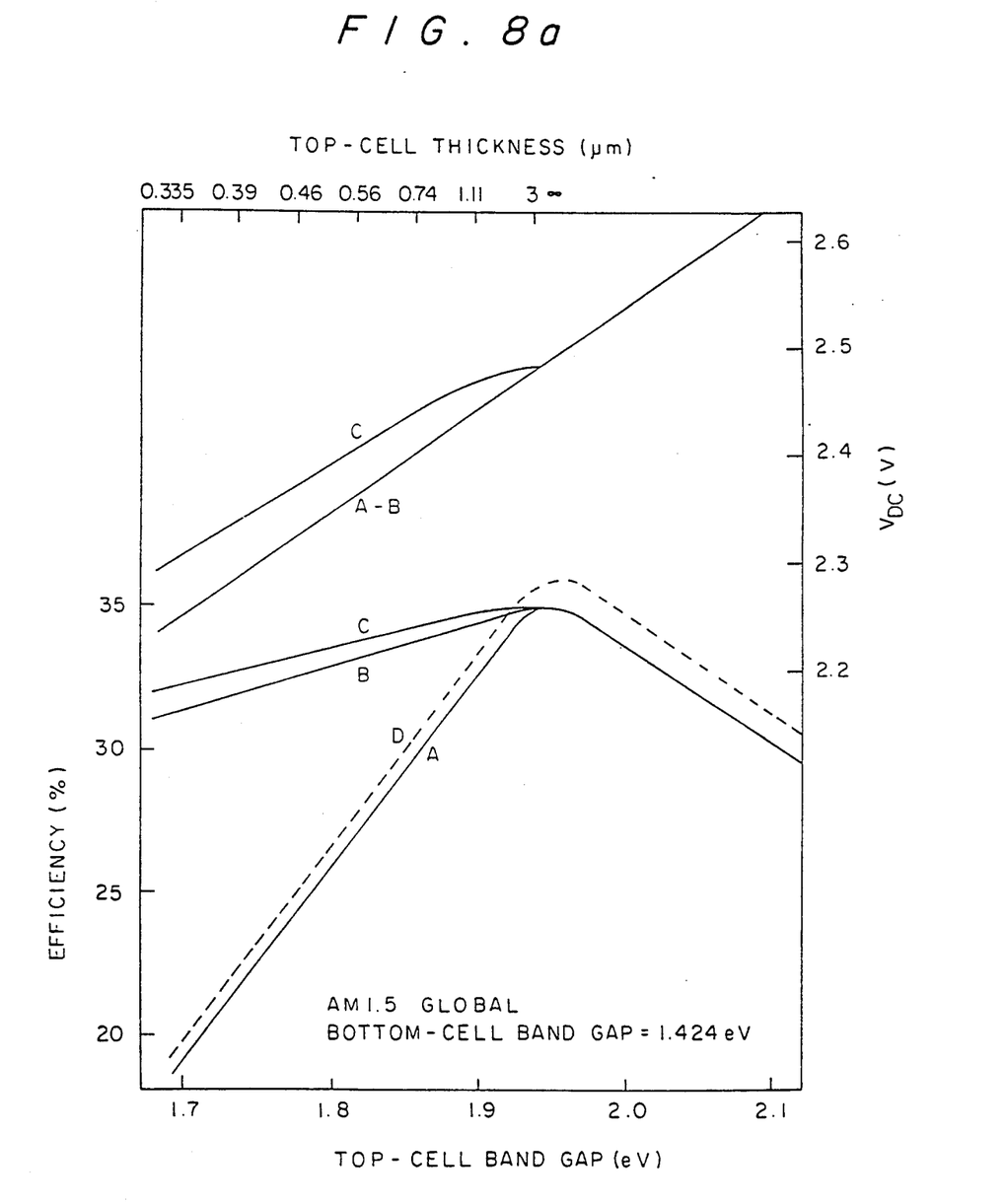
FIG. 8 shows the top-cell thicknesses as a function of top-cell band gap to achieve the current-matched condition for a bottom cell with band gap 1.424 eV, wherein parameters applicable to Ga$_x$In$_{l-x}$P were used for the absorption calculation, and these thicknesses were used for calculation for curves B and C in FIG. 6.
Figure 8B:
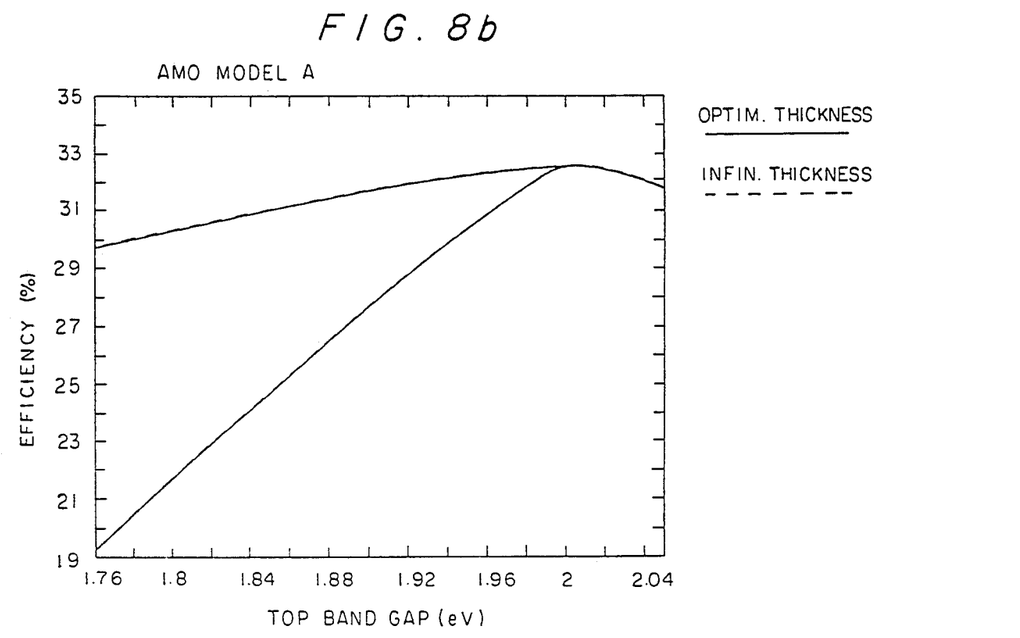
Figure 8C:
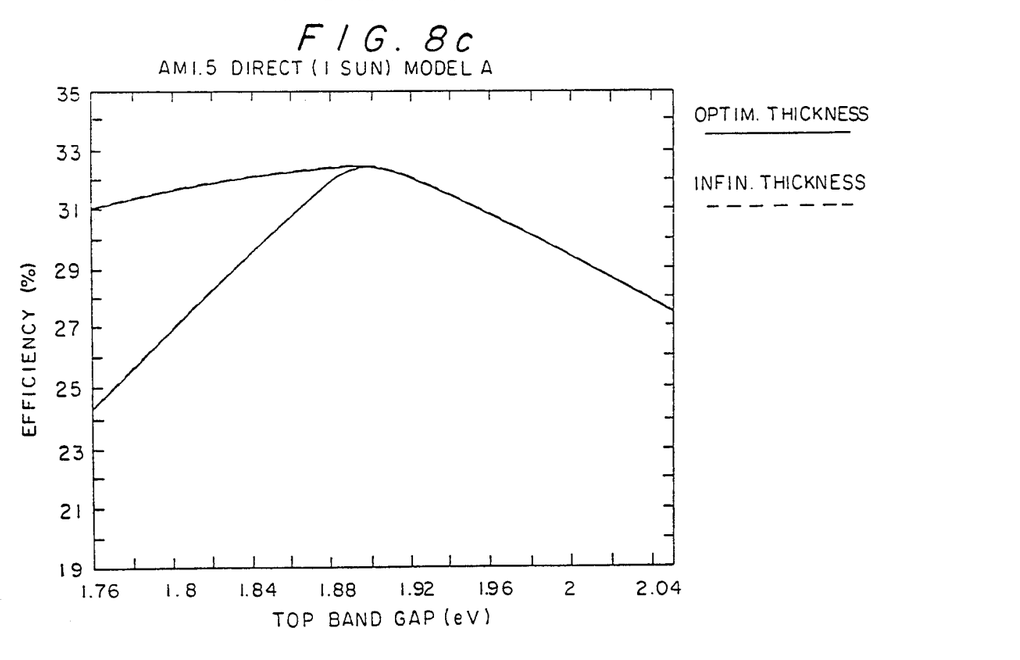
Figure 9:
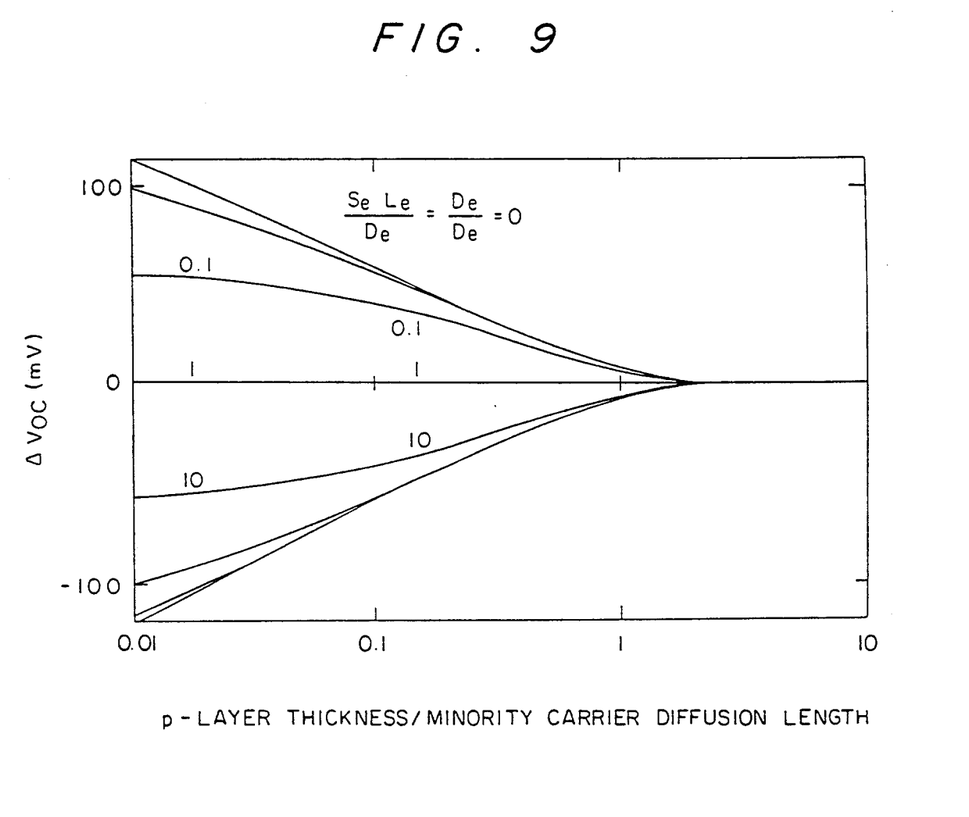
FIG. 9 in the lower portion of the Figure shows the top-cell (solid lines) and bottom-cell (dashed lines) currents as a function of top-cell thickness and band gap. The upper portion shows the corresponding tandem-cell efficiencies. A band gap of 1.424 eV was used for the bottom cell. Band gaps of A) 1.70 eV, B) 1.85 eV, C) 1.90 eV, D) 1.92 eV, E) 1.94 eV, and F) 1.96 eV were used for the top cells.

The thickness which were used for the calculations in FIG. 6a are noted at the top of FIG. 6a and are replotted for easy reference in FIG. 7. The only practical limitation for implementing these thinner cells is control of the layer thickness and uniformity. This can be evaluated from FIG. 9, which shows the efficiency and bottom-cell and top-cell currents as a function of top-cell thickness and band gap, assuming a bottom cell with a band gap of 1.424 eV. If one assumes that the thickness can be controlled to $+/-10\%$, a band gap as low as 1.85 eV still has an ideal efficiency of between 33% and 34%. However, a band gap as low as 1.70 eV is not practical since a 10% variation of thickness would result in a variation of several efficiency points. FIG. 9 is of particular interest for the system GaAs/Ga$_{0.5}$In$_{0.5}$P since the band gap of Ga$_{0.5}$In$_{0.5}$P varies anomalously with deposition conditions from about 1.82 eV to about 1.90 eV[21]. FIGS. 8 and 9 show an optimal top-cell thickness of about 0.75 μm for a cell GaAs/Ga$_{0.5}$In$_{0.5}$P with top-cell band gap of 1.85-1.86 eV. Thus, there was fabricated a current-matched, 27% efficient tandem cell with a top-cell band gap of 1.85-1.86 eV using a thickness of about 0.7 μm. Given the assumptions for the model (e.g. no surface recombination) which is an especially bad assumption for the top cell) and experimental uncertainties (in the absorption coefficient and thickness measurements) this is very good agreement between theory and experiment.

[21] S.R. Kurtz, J.M. Olson and A. Kibbler, Solar Cells 24,307 (1988); A. Gomyo, T. Suzuki, and S. Iijima, *Phys. Rev. Lett.*, 60,2645 (1988).

Strictly speaking, the optimal top-cell thickness would be achieved for the current-matched condition at the maximum-power point, rather than under the short-circuit conditions as calculated. However, this difference is quite small, for high band gap devices, as can be seen from FIG. 9. This difference becomes significantly greater for lower band gap cells that have small fill factors.

Figure 6B:
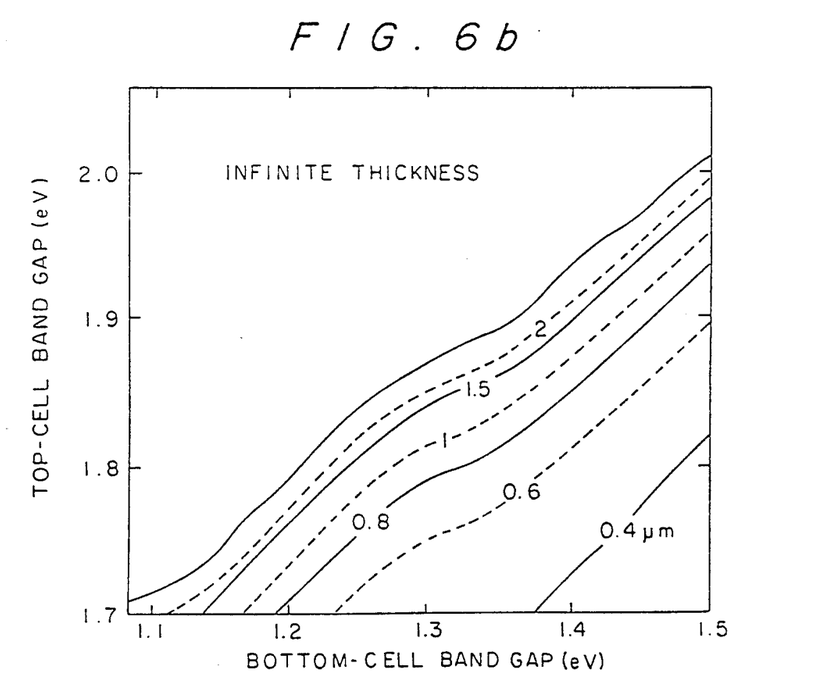
FIG. 6b shows efficiency curves A and C as shown in FIG. 6a, except that AMO irradiance spectra were used.
Figure 6C:
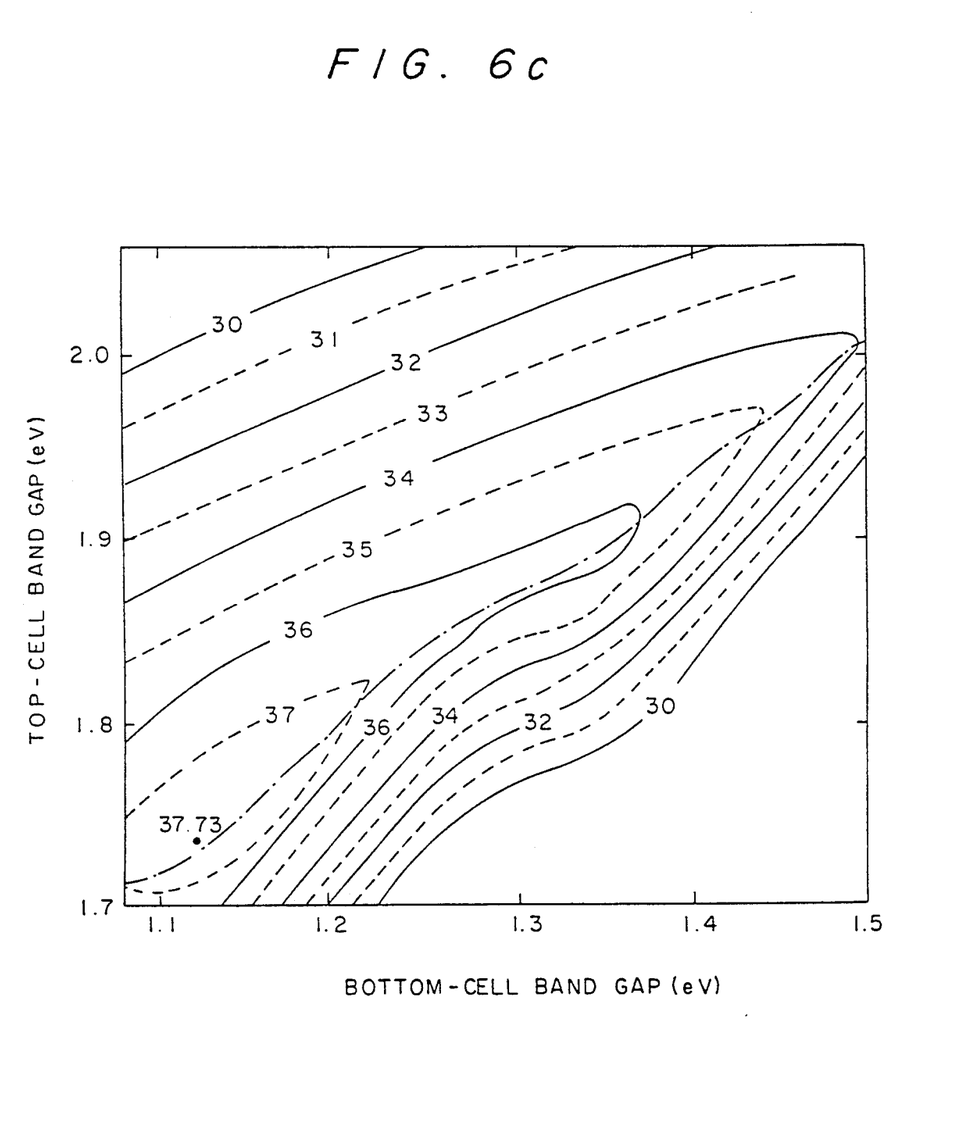
FIG. 6c shows efficiency curves A and C as shown in FIG. 6a, except that AM1.5 direct normal irradiance spectra were used.

The efficiency of the series-connected tandem cells under different irradiance spectra can be compared in FIGS. 6a, 6b, and 6c. At lower air mass the spectrum has more short-wavelength light, increasing the optimal top-cell band gap for a GaAs bottom cell. However, the effect of thinning the top cell is roughly equivalent in each case. The top-cell thicknesses used in FIG. 6a and plotted in FIG. 8 would be almost identical for FIGS. 6b and 6c if correction is made for the difference in optimal top-cell band gap.

The figures showing the thicknesses required for current matching were all obtained using the absorption coefficient of GaInP$_2$ for the top cell, and these results can easily be used on other systems by increasing or decreasing the thickness proportionally when the absorption coefficient is smaller or larger, respectively.

The foregoing calculated efficiencies of two-junction, series-connected tandem solar cells with optimized top-cell thicknesses and the thinning of the top-cell thickness in some cases resulted in large increases in the calculated efficiencies. Moreover, most of the increase came from a higher $J_{sc}$ since current matching could be achieved. In cases of low surface-recombination velocities, the $V_{oc}$, also increased when the top cell was thinned. It is clear that, a thin top cell in a tandem structure is shown to be feasible even when the top-cell band gap is decreased by 10 meV from the optimal band gap.

The description hereinabove is considered illustrative only of the principles of the invention, and numerous modifications and changes will readily occur to those skilled in the art. Accordingly, all suitable modifications and equivalents may be resorted to falling within the scope of the invention as defined by the claims that follow.

The embodiments of the invention in which an exclusive property or privilege is claimed are defined as follows:

1. A high-efficiency multijunction photovoltaic solar cell, consisting essentially of:

a top semiconductor cell fabricated from Ga$_x$In$_{1-x}$P wherein x is (0<x<0.5) a light-sensitive n/p homojunction therein for absorbing higher energy photons;

a bottom semiconducor cell fabricated from GaAs with a light sensitive n/p homojunction therein for absorbing lower energy photons; and wherein said top cell thickness is optimized by thinning to from 0.5 to 1.7 micorsn and less than said bottom cell thickness in order to provide current matching between said top cell and said bottom cell in order to obtain improved conversion efficiency for AMO and AM1.5;

a low-resistance attachment between the top cell and the bottom cell, wherein said top cell is lattice matched to said bottom cell; and electrical contact means attached to opposite sides of said solar cell to conduct current away from and into said solar cell.

2. The multijunction photovoltaic solar cell claim 1, wherein said Ga$_x$In$_{1-x}$P has a band gap of about 1.9 eV.

3. The multijunction photovoltaic solar cell of claim 2 wherein said bottom cell comprises a p+GaAs substrate with a p-GaAs absorber layer deposited on said substrate, and an n$^{30}$-GaAs emitter layer deposited on said p-GaAs absorber layer.

4. The multijunction photovoltaic cell of claim 2, which, when exposed to solar radiation, has an open circuit voltage ($V_{oc}$) equal to at least 2.3 V, a short circuit current ($J_{sc}$) of at least 13.6 mA/cm$^2$(ARC), a fill factor (FF) of at least 0.87, and an efficiency of at least 27.3% Am1.

5. An improved method of converting solar radiation to electrical energy, comprising the steps of:

directing the solar radiation into a first cell comprising Ga$_x$In$_{1-x}$P, where X=0.51±0.05, with a band gap of about 1.9 eV, and having an n/p homojunction therein for absorbing and converting solar radiation of a wavelength of about 0.65 μm or less to electrical energy to product about 1.4V of open-circuit voltage;

directing unabsorbed solar radiation into a second cell comprising GaAs that is integrally grown and lattice connected with said $Ga_xIn_{1-x}P$ and having an n/P homojunction therein for absorbing and converting the remaining solar radiation of wavelength of about 0.85 μm or less to electrical energy to produce about 1V of open-circuit voltage, which GaAs second cell is lattice-matched with said $Ga_xIn_{1-x}P$ first cell at a low resistance tunnel heterojunction; and connecting said first and second cells in series to an electrical load wherein said first cell thickness is optimized by thinning from 0.5 to 1.7 microns and less than the second cell thickness in order to provide current matching between said first cell and said second cell to obtain improved energy conversion efficiency for AMO and AM1.5.

6. A method of converting solar radiation to electrical energy, comprising:

directing solar radiation into a $Al_yGa_{1-y}As$ top cell is optimized by thinning from 0.5 to 1.7 microns and is less than the thickness of the GaAs bottom cell; said top cell is latticed matched at a p+/n+GaAs tunnel-junction interface with said bottom cell and in which there is an n/p homojunction in the top cell and another n/p homojunction in said bottom cell;

absorbing higher energy solar radiation of 0.65 μm or greater wavelengths in said top cell and converting it to electrical energy in said top cell while allowing lower energy solar radiation to pass through said top cell into said bottom cell;

absorbing lower energy radiation of 0.65 μm or greater wavelength and converting it in said bottom cell to electrical energy;

connecting said device to an electric load; wherein said top thickness is thinned to less than said bottom cell thickness in order to provide current matching between said top cell and said bottom cell to obtain improved current conversion efficiency; and converting the solar radiation to electrical energy of at least $V_{oc}=2.9V$, $J_{sc}=13.6$ mA/cm$^2$, and a FF=0.87 with an efficiency of at least 27.3% AM1.

7. A high-efficiency multijunction photovoltaic solar cell, consisting essentially of:

a top semiconductor cell fabricated from $Al_yGa_{1-y}Al$, wherein y=0.3-0.4, with a light-sensitive n/p homojunction therein for absorbing higher energy photons;

a bottom semiconductor cell fabricated from GaAs with a light sensitive n/p homojunction therein for absorbing lower energy photons; and wherein said top cell thickness is optimized by thinning from 0.5 to 1.7 microns and less than said bottom cell thickness in order to provide current matching between said top cell and said bottom cell in order to obtain improved conversion efficiency for AMO and AM1.5;

a low-resistance attachment between the top cell and the bottom cell wherein said top cell is lattice matched to said bottom cell; and electrical contact means attached to opposite sides of said solar cell to conduct current away from and into said solar cell.

8. A high-efficiency multijunction photovoltaic solar cell, consisting essentially of:

a top semiconductor cell fabricated from GaAs with a light-sensitive n/p homojunction therein for absorbing higher energy photons;

a bottom semiconductor cell fabricated from Ge with a light sensitive n/p homojunction therein for absorbing lower energy photons; and wherein said top cell thickness is optimized by thinning from 0.5 to 1.7 microns and less than said bottom cell thickness in order to provide current matching between said top cell and said bottom cell in order to obtain improved conversion efficiency for AMO and AM1.5;

a low-resistance attachment between the top cell and the bottom cell wherein said top cell is lattice matched to said bottom cell; and electrical contact means attached to opposite sides of said solar cell to conduct current away from and into said solar cell.

9. A high-efficiency multijunction photovoltaic solar cell, consisting essentially of:

a top semiconductor cell fabricated from $Ga_xIn_{1-x}P$, wherein x is (0<x<0.5), with a light-sensitive n/p homojunction therein for absorbing higher energy photons;

a bottom semiconductor cell fabricated from $Ga_{x+0.5}In_{0.5-x}As$, wherein x is (0<x<0.5), with a light sensitive n/p homojunction therein for absorbing lower energy photons; and wherein said top cell thickness is optimized by thinning from 0.5 to 1.7 microns and less than said bottom cell thickness in order to provide current matching between said top cell and said bottom cell in order to obtain improved conversion efficiency for AMO and AM1.5;

a low-resistance attachment between the top cell and the bottom cell wherein said top cell is lattice matched to said bottom cell; and electrical contact means attached to opposite sides of said solar cell to conduct current away from and into said solar cell.

* * * * *